United States Patent
Prasher et al.

(10) Patent No.: US 6,934,154 B2
(45) Date of Patent: Aug. 23, 2005

(54) MICRO-CHANNEL HEAT EXCHANGERS AND SPREADERS

(75) Inventors: Ravi Prasher, Tempe, AZ (US); Ravi Mahajan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 10/404,215

(22) Filed: Mar. 31, 2003

(65) Prior Publication Data

US 2004/0190252 A1 Sep. 30, 2004

(51) Int. Cl.[7] .................................................. H05K 7/20
(52) U.S. Cl. ...................... 361/699; 361/689; 361/698; 257/714; 174/15.1; 165/80.4; 165/185
(58) Field of Search ................................ 361/698, 699, 361/700–704; 257/714, 715; 165/80.4, 104.26, 104.33; 174/15.1, 15.2; 62/259.2

(56) References Cited

U.S. PATENT DOCUMENTS

| | | | | |
|---|---|---|---|---|
| 4,894,709 A | * | 1/1990 | Phillips et al. | 257/714 |
| 5,099,311 A | * | 3/1992 | Bonde et al. | 165/80.4 |
| 5,870,823 A | * | 2/1999 | Bezama et al. | 29/848 |
| 5,901,037 A | * | 5/1999 | Hamilton et al. | 361/699 |
| 6,344,686 B1 | * | 2/2002 | Schaeffer et al. | 257/712 |
| 6,388,317 B1 | * | 5/2002 | Reese | 257/713 |
| 6,400,012 B1 | * | 6/2002 | Miller et al. | 257/712 |
| 6,704,200 B2 | * | 3/2004 | Zeighami et al. | 361/700 |
| 6,785,134 B2 | * | 8/2004 | Maveety et al. | 361/699 |
| 2004/0113265 A1 | * | 6/2004 | DiBattista et al. | 257/714 |

* cited by examiner

*Primary Examiner*—Boris Chérvinsky
(74) *Attorney, Agent, or Firm*—Blakely, Sokoloff, Taylor & Zafman LLP

(57) ABSTRACT

Two-phase microchannel heat exchangers for cooling integrated circuit (IC) dies and cooling systems employing the same are disclosed. The heat exchangers include thermal masses having a plurality of microchannels formed therein. In one set of configurations, the IC die is coupled to a thermal mass having a plurality of open microchannels such that a hermetic seal is formed between the die and the bases of the microchannel walls, thus forming a plurality of closed microchannels. In another set of configurations, a separate microchannel heat exchanger is thermally coupled to an IC die and operatively coupled to the IC die via coupling to a substrate on which the IC die is mounted. The microchannel heat exchangers may be employed in a closed loop cooling system includes a pump and a heat rejecter. The microchannels are configured to support two-phase heat transfer using a working fluid such as water.

30 Claims, 5 Drawing Sheets

MICRO-CHANNEL HEAT EXCHANGERS AND SPREADERS

FIELD OF THE INVENTION

The field of invention relates generally to cooling electronic apparatus' and systems and, more specifically but not exclusively relates to microchannel cooling technology.

BACKGROUND INFORMATION

Components in computer systems are operating at higher and higher frequencies, using smaller die sizes and more densely packed circuitry. As a result, these components, especially microprocessors, generate large amounts of heat, which must be removed from the system's chassis so that the components do not overheat. In conventional computer systems, this is accomplished via forced air convection, which transfers heat from the circuit components by using one or more fans that are disposed within or coupled to the chassis to draw air over the components through the chassis. To further aid the heat removal process, heat sinks are often mounted to various high-power circuit components to enhance natural and forced convection heat transfer processes. Heat sinks comprising of an array of fins having a height of approximately 1–2 inches are commonly used to cool microprocessors in desktop systems, workstations, and pedestal-mounted servers. The heat sinks provide significantly greater surface areas than the components upon which they are mounted.

For example, a typical processor cooling solution that employs a heatsink is shown in FIG. 1. The cooling solution is designed to cool a processor die 100, which is flip-bonded to a substrate 102 via a plurality of solder bumps 104. Typically, an epoxy underfill 106 is employed to strengthen the interface between die 100 and substrate 102. Substrate 102, in turn, is mounted to a chip carrier 108 via a plurality of solder balls 110. The upper side of the die is thermally coupled to a copper heat spreader 112 via a first layer of thermal interface material (TIM) 114. Similarly, a heat sink 118 is thermally coupled to the copper heat spreader via a second layer of TIM 118.

During operation, processor die generates heat due to resistive losses in its circuitry. This heats up the processor. Since heat flows high temperature sources to lower temperature sinks, heat is caused to flow through TIM layer 114 to copper spreader 112. In turn, heat from the spreader flows through TIM layer 118 to heat sink 116. The heat sink, in turn, is cooled by air that flows over the heat sink's fins 120, either via natural convection or forced convection. Generally, the rate of cooling is a function of the fin area and the velocity of the air convection.

Thermal solutions are even more difficult for smaller processor-based devices, such as laptop computers and the like. In this instance, the amount of space available for heat sinks and heat spreaders is minimal, thereby causing the heat transfer capacity to be significantly reduced. The power available to drive fans is also significantly reduced. Even with the use of lower-power dies, the reduced heat transfer capacity often leads to the processors running derated speeds via self-regulation in response to over temp conditions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 2b is a cross-section view of a conventional microchannel heat exchanger that may be employed in the closed loop cooling system of FIG. 2a;

FIG. 5b is a cross section view illustrating further details of the channel configuration parameters of FIG. 5a.

DETAILED DESCRIPTION OF PREFERRED EMBODIMENTS

Embodiments of microchannel heat exchanger apparatus and corresponding methods are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2B:
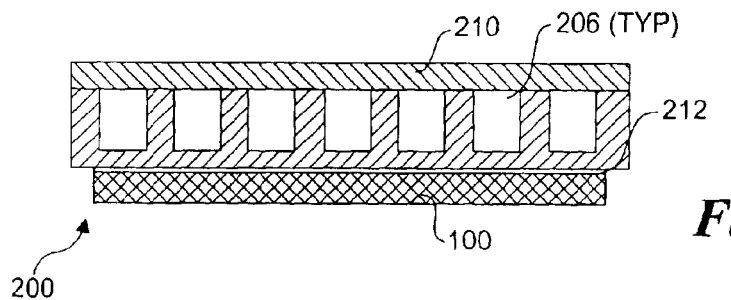
Figure 2A:
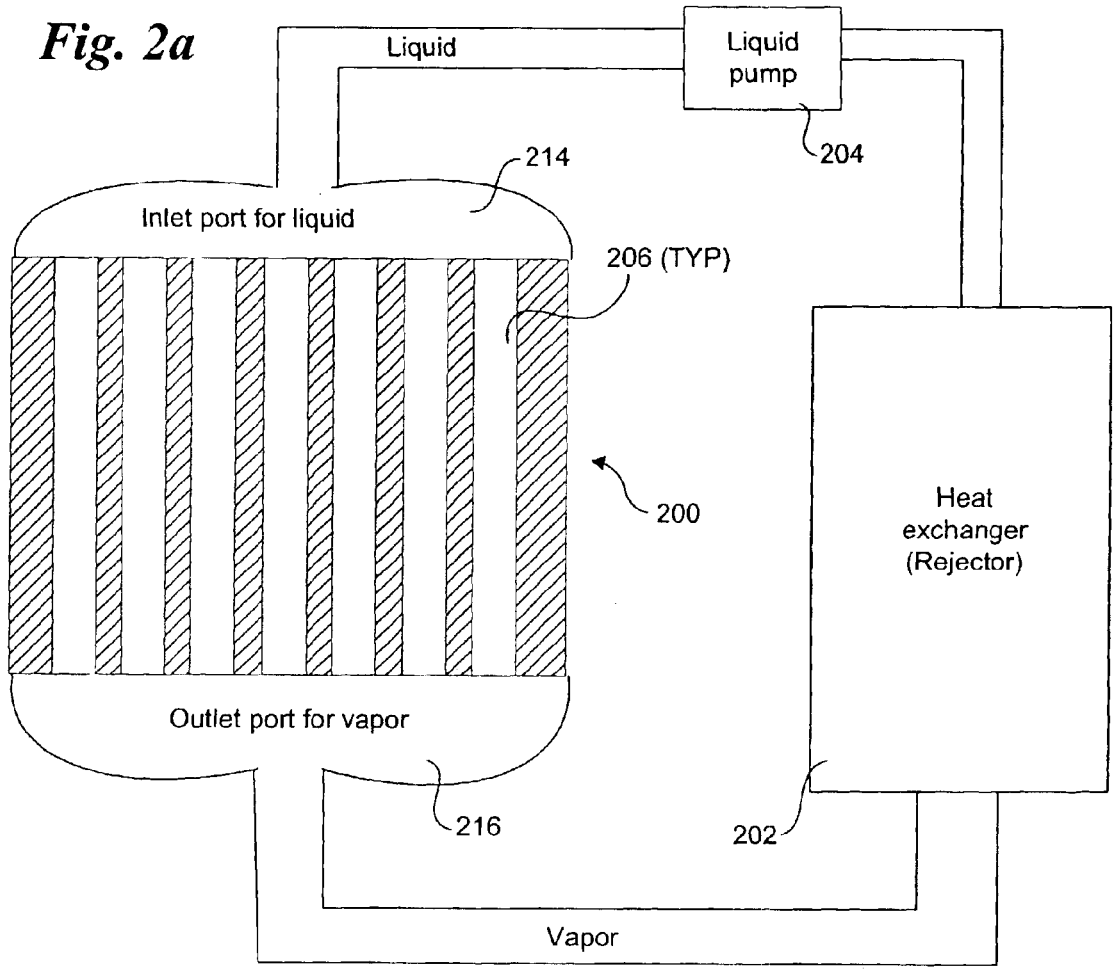
FIGS. 2a is a schematic diagram of a closed loop cooling system employing a microchannel heat exchanger.

Recently, research efforts have been focused on providing thermal solutions for densely-packaged high-power electronics. A leading candidate emerging from this research is the use of two-phase convection in micromachined silicon heat sinks, commonly referred to as microchannels. A typical configuration for a microchannel-based cooling system is shown in FIG. 2a and 2b. The system includes a microchannel heat exchanger 200, a heat rejecter 202, and a pump 204. The basic premise is to take advantage of the fact that changing a phase of a fluid from a liquid to a vapor requires a significant amount of energy, known as latent heat, or heat of vaporization. Conversely, a large amount of heat can be removed from the fluid by returning the vapor phase of back to liquid. The microchannels, which typically have hydraulic diameters on the order of hundred-micrometers, are very effective for facilitating the phase transfer from liquid to vapor.

In accordance with typical configurations, microchannel heat exchanger 200 will comprise a plurality of microchannels 206 formed in a block of silicon 208, as shown in FIG. 2b. A cover plate 210 is then placed over the top of the channel walls to formed enclosed channels. Generally the microchannel heat exchanger performs the function of a heat sink or heat spreader/heat sink combination. Accordingly, in FIG. 2b the microchannel heat exchanger is shown as thermally coupled to a die 100 via a TIM layer 212. In an optional configuration, a processor die with an increased thickness may include channels formed in the processor die silicon itself.

As the die circuitry generates heat, the heat is transferred outward to the microchannel heat exchanger via conduction. The heat increases the temperature of the silicon, thereby heating the temperature of the walls in the microchannels. Liquid is pushed by pump 204 into an inlet port 214, where it enters the inlet ends of microchannels 206. As the liquid passes through the microchannels, further heat transfer takes place between the microchannel walls and the liquid. Under a properly configured heat exchanger, a portion of the fluid exits the microchannels as a vapor at outlet port 216. The vapor then enters heat rejecter 202. The heat rejecter comprises a second heat exchanger that performs the reverse phase transformation as microchannel heat exchanger 200—that is, it converts the phase of the vapor entering at an inlet end back to a liquid at the outlet of the heat rejecter. The liquid is then received at an inlet side of pump 204, thus completing the cooling cycle.

A significant advantage of the foregoing scheme is that is moves the heat rejection from the processor/die, which is typically somewhat centrally located within the chassis, to the location of the heat rejecter heat exchanger, which can be located anywhere within the chassis, or even externally. Thus, excellent heat transfer rates can be obtained without the need for large heatsinks/spreaders and high airflow rates.

However, there are a number of practical problems in the fabrication of microchannels in the silicon block or the silicon die itself. These problems include: bulk machining of brittle silicon might break the silicon; post silicon micromachining may impact IC yields; conventional etching can be used to make the channels, but the etching time required would be extensive; microchannels formed in silicon may reduce the mechanical strength of the silicon or die; IC fabrication processes are well-defined, with corresponding manufacturing infrastructure—introducing one or more extra fabrication processes could disrupt process flows and productivity; and formation of microchannels may lead to contamination or breaking of the die circuitry.

In accordance with aspects of the present invention, embodiments of microchannel heat exchangers and corresponding cooling solutions are disclosed herein that employ components that are do not suffer from the problems discussed above with respect to conventional approaches. Furthermore, these microchannel heat exchangers provided enhanced cooling rates when compared with silicon-based components.

Figure 3A:
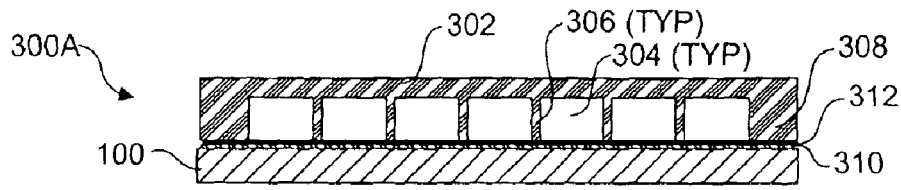
FIG. 3a is a cross-section view of a microchannel heat exchanger that is integrated with an integrated circuit (IC) die in accordance with an embodiment of the invention, wherein a thermal mass including a plurality of open microchannels is coupled to the IC die using a solder and the bottom surfaces of the microchannels comprise the solder material.

A microchannel heat exchanger 300A in accordance with one embodiment of the invention is shown in FIG. 3a. The microchannel heat exchanger includes a metallic thermal mass 302 in which a plurality of microchannels 304 are formed. Metallic thermal mass 302 may be configured in various shapes, including the block shape shown in FIGS. 3a–d. For point of illustration, the size and configuration of the microchannels formed in the metallic thermal mass are exaggerated for clarity; details of exemplary channel configurations are discussed below with reference to FIGS. 5A and 5B. In accordance with principles of the embodiment, the thermal mass is mounted over an integrated circuit (IC) die 100 such that a hermetic seal is formed between the bases of internal channel walls 306 and external channel walls 308 and the top of the die. Thus, each of channels 304 comprises a closed volume configured to facilitate two-phase heat transfer in the manner discussed above.

In the embodiment illustrated in FIG. 3a, the hermetic seal is formed by soldering metallic thermal mass 302 to die 100. In particular, the bases of internal channel walls 306 and external channel walls 308 are soldered to a layer of solderable material 310 affixed to the top side of the die using a solder 312. Generally, solderable material 310 may comprise any material to which the selected solder will bond. Such materials include but are not limited to metals such as copper (Cu), gold (Au), nickel (Ni), aluminum (Al), titanium (Ti), tantalum (Ta), silver (Ag) and Platinum (Pt). In one embodiment, the layer of solderable material comprises a base metal over which another metal is formed as a top layer. In another embodiment, the solderable material comprises a noble metal; such materials resist oxidation at solder reflow temperatures, thereby improving the quality of the soldered joints.

Generally, the layer (or layers) of solderable material may be formed over the top surface of the die 100 using one of many well-known techniques common to industry practices. For example, such techniques include but are not limited to sputtering, vapor deposition (chemical and physical), and plating. The formation of the solderable material layer may occur prior to die fabrication (i.e., at the wafer level) or after die fabrication processes are performed.

In one embodiment solder 312 may initially comprise a solder preform having a pre-formed shape conducive to the particular configuration of the bonding surfaces. The solder preform is placed between the die and the metallic thermal mass during a pre-assembly operation and then heated to a reflow temperature at which point the solder melts. The temperature of the solder and joined components are then lowered until the solder solidifies, thus forming a bond between the joined components. Furthermore, the solidified solder forms a hermetic seals between the bottom of the internal and external walls and the top of the die.

Figure 3B:
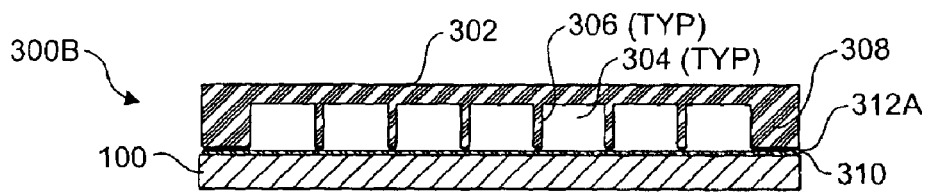
FIG. 3b is a cross-section view of a microchannel heat exchanger that is integrated with an IC die in accordance with an embodiment of the invention, wherein a thermal mass including a plurality of open microchannels is coupled to the IC die using a solder and the bottom surfaces of the microchannels comprise a solderable material.

As shown in FIG. 3b, a solder preform 312A that is configured such that there is a reduced amount of solder (preferably none) between the base of the microchannels and solderable material layer 310 is employed in a microchannel heat exchanger 300B. This embodiment provides improved heat transfer when compared with the embodiment of FIG. 3A because the thermal resistance represented by the solder material between the microchannels and the solderable material layer is removed.

Figure 3C:
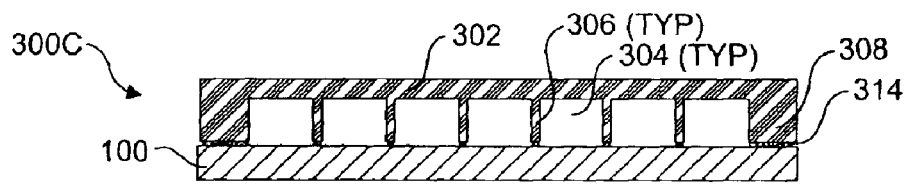
FIG. 3c is a cross-section view of a microchannel heat exchanger that is integrated with an IC die in accordance with an embodiment of the invention, wherein a thermal mass including a plurality of open microchannels is coupled to the IC die using a thermal adhesive.

In another embodiment corresponding to a microchannel heat exchanger 300C shown in FIG. 3c, a thermal adhesive 314 is used in place of a solder for securing the bases of internal channel walls 306 and external channel walls 308 to IC die 100. Thermal adhesives, sometimes called thermal epoxies, are a class of adhesives that provide good to excellent conductive heat transfer rates. Typically, a thermal adhesive will employ fine portions (e.g., granules, slivers, flakes, micronized, etc.) of a metal or ceramic, such as silver or alumina, distributed within in a carrier (the adhesive), such as epoxy. As shown in FIG. 3c, in this embodiment the silicon die forms one of the microchannel walls, providing excellent heat transfer to the working fluid, particular when the ratio of the channel width to the wall width is large. Another advantage obtained when using some types of thermal adhesives, such as alumina products, concerns the fact that these thermal adhesives are also good insulators, thereby providing an electric isolation between the die circuitry and the metallic microchannel thermal mass.

A further consideration related to the embodiment of FIG. 3c is that the thermal mass need not comprise a metal. In general, the thermal mass may be made of any material that provides good conduction heat transfer properties. For example, a ceramic carrier material embedded with metallic pieces in a manner to the thermal adhesives discussed above may be employed for the thermal mass. It is additionally noted that a thermal mass of similar properties may be employed in the embodiments of FIGS. 3a and 3c if a layer of solderable material is formed over surface areas that are soldered to the IC die (i.e., the wall bases).

Figure 1:
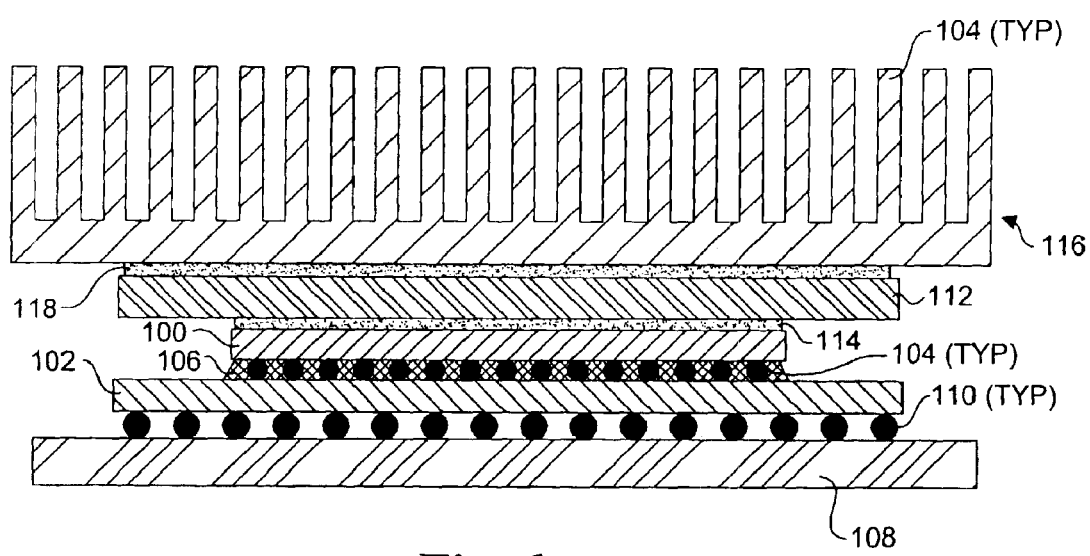
FIG. 1 is a cross-section view of a conventional cooling assembly employing a metallic spreader and heat sink.
Figure 3D:
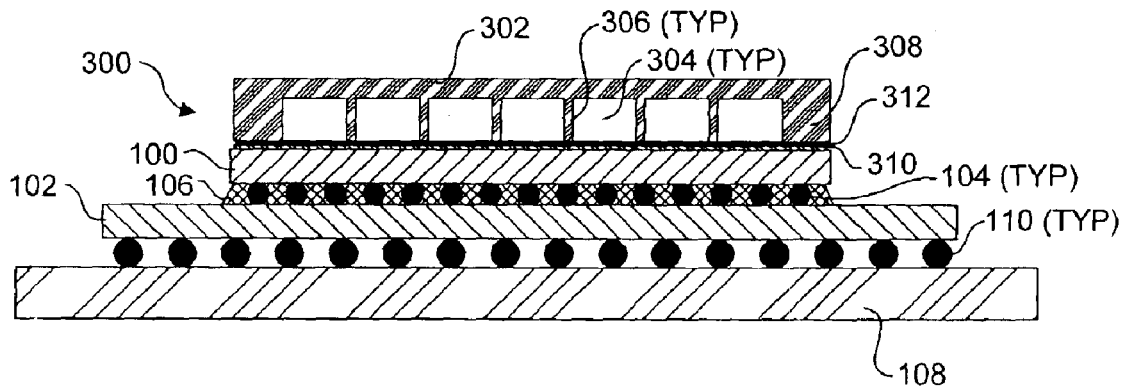
FIG. 3d is a cross-section view of a exemplary IC package in which the components of FIG. 3a are coupled to a substrate and a chip carrier.

An IC package 320 corresponding to an exemplary use of microchannel heat exchanger 300A is shown in FIG. 3d. The lower portion of the package is similar to the assembly shown in FIG. 1. Accordingly, IC die 100 is flip-bonded to substrate 102 via solder bumps 104, while substrate 102 is secured to chip carrier 108 via a plurality of solder balls 110. It is noted that a similar package configuration may be employed for each of microchannel heat exchangers 300A and 300B.

Figure 4A:
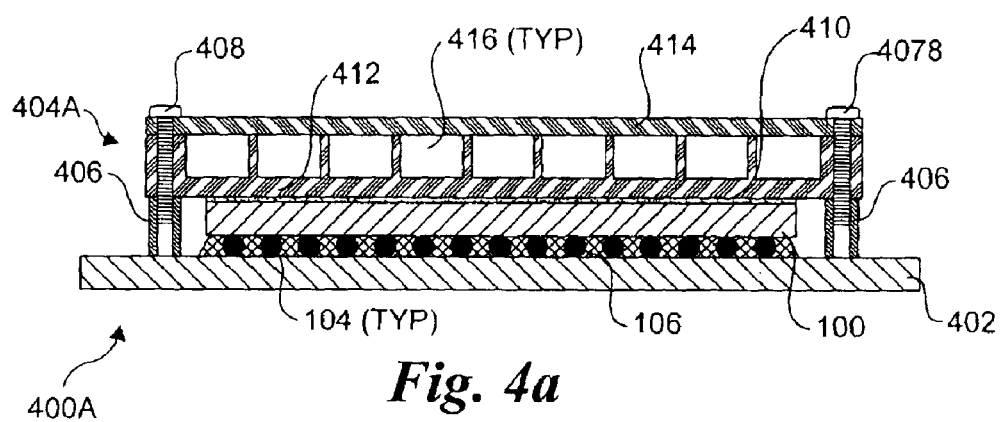
FIG. 4a is cross-section view of a microchannel heat exchanger that is coupled to an IC die via a thermal interface material layer in accordance with an embodiment of the invention, wherein the microchannel heat exchanger includes a thermal mass having a plurality of open microchannel covered by a plate.
Figure 4B:
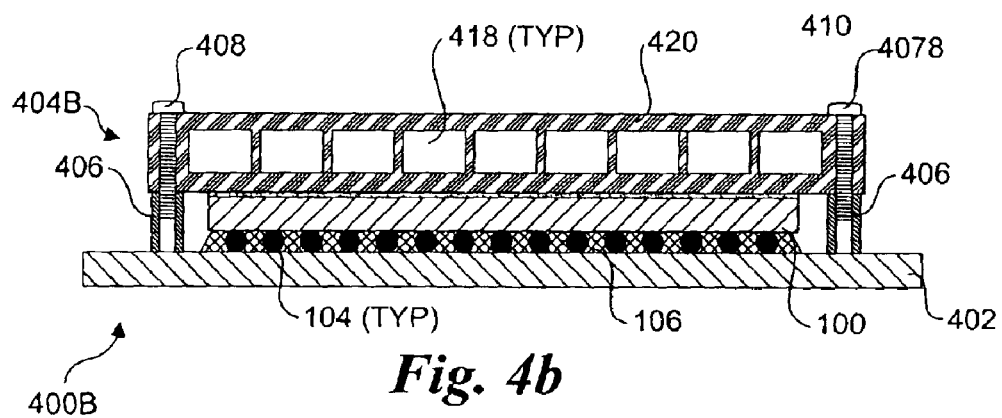
FIG. 4b is a cross-section view of a microchannel heat exchanger that is coupled to an IC die via a thermal interface material layer in accordance with an embodiment of the invention, wherein the microchannel heat exchanger comprises a single-piece thermal mass in which a plurality of microchannels are formed.
Figure 4C:
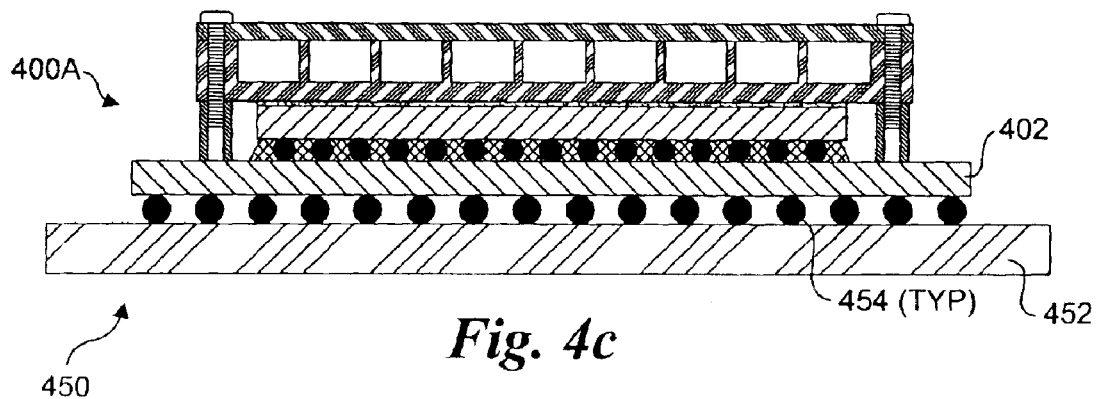
FIG. 4c is a cross-section view of a exemplary IC package in which the components of FIG. 4a are coupled to a substrate and a chip carrier.

In an alternative scheme, depicted in FIGS. 4a–c, a separate microchannel heat exchanger is thermally coupled to an IC die via a TIM layer, while the heat exchanger is operatively coupled to the die via a physical coupling to a substrate on which the die is mounted. For example, in the assembly 400A illustrated in FIG. 4a, an IC die 100 is mounted to a substrate 402. For illustrative purposes, the die is shown to be flipped-bounded to the substrate; however, this is merely an exemplary mounting scheme, and is not meant to be limiting. A microchannel heat exchanger 404A is then operatively coupled to the die via a physical coupling to substrate 402. In general, this physically coupling can be provided by one of many well-known assembly techniques, such as via appropriate fasteners and/or adhesives. In the illustrated embodiment, a plurality of standoffs 406 are coupled to substrate 402, while the microchannel heat exchanger is coupled to the standoffs via threaded fasteners 408. For simplicity, the configuration for attaching the standoffs to the substrate is not shown—any of many well-known physical coupling techniques may be employed for this purpose.

As shown in FIGS. 4a–c, the bases of microchannel heat exchangers 404A and 404B are not directly coupled to the dies, but rather are thermally coupled via TIM layers 410. The TIM layer performs several functions. Foremost, it provides a conductive heat transfer path between the microchannel heat exchanger and the top of the die. It also enables the various assembly components to contract and expand in response to temperature changes without inducing any stress on the assembled component while maintaining a good thermal conduction path. For instance, in response to an increase in temperature, most materials expand, while those same materials contract when their temperature is lowered. This rate of expansion/contraction is generally a fixed rate (at least locally) corresponding to the material's coefficient of thermal expansion (CTE). When the CTE for joined materials differs, one material expands or contracts relative to the other, inducing a stress at the joint between the materials. The CTE mismatch can lead to failure at the joint, especially when thermal cycling is occurs.

In most configurations, the material used for the standoffs will be a metal, such as aluminum, steel, or copper. These metals have higher CTE's than typical die materials (semiconductors, such as silicon). As a result, when the temperature increases, the thickness of the TIM layer will increase due to the higher expansion rate of the metal standoff than the die. Since the TIM layer is very compliant and adheres to the two material faces, it easily accommodates this expansion. At the same time, the metal in the microchannel heat exchanger expands horizontally at a different rate than the die does. The relative expansion between the two components is also easily handled by the TIM layer.

Assemblies 400A and 400B are substantially similar except for their respective microchannel heat exchangers 404A and 404B. Microchannel heat exchanger 404A comprises a metallic thermal mass 412 having a plurality of open channels formed therein. A plate 414 is employed to close the channels, thereby forming closed microchannels 416. Ideally, the plate should be coupled to the top of the channel walls in a manner that forms a hermitic seal. If necessary, one of several well-known sealants may be disposed between the plate and the tops of the channel walls to facilitate this condition. In one embodiment, plate 414 is soldered to thermal mass 412, in a manner similar to that discussed above with reference to FIGS. 3a and 3b.

In contrast, a plurality of closed microchannels 418 are formed in a metallic thermal mass 420 for microchannel heat exchanger 400B, thus eliminating the need for a hermetic seal. In general, microchannels 418 may be formed using one of many metal-forming techniques, such as casting, forging, and machining (e.g., electrical discharge machining).

An exemplary package 450 made from assembly 400A is shown in FIG. 4c. In the illustrated embodiment, substrate 402 is mounted to a chip carrier 452 via a plurality of solder balls 454.

Figure 5A:
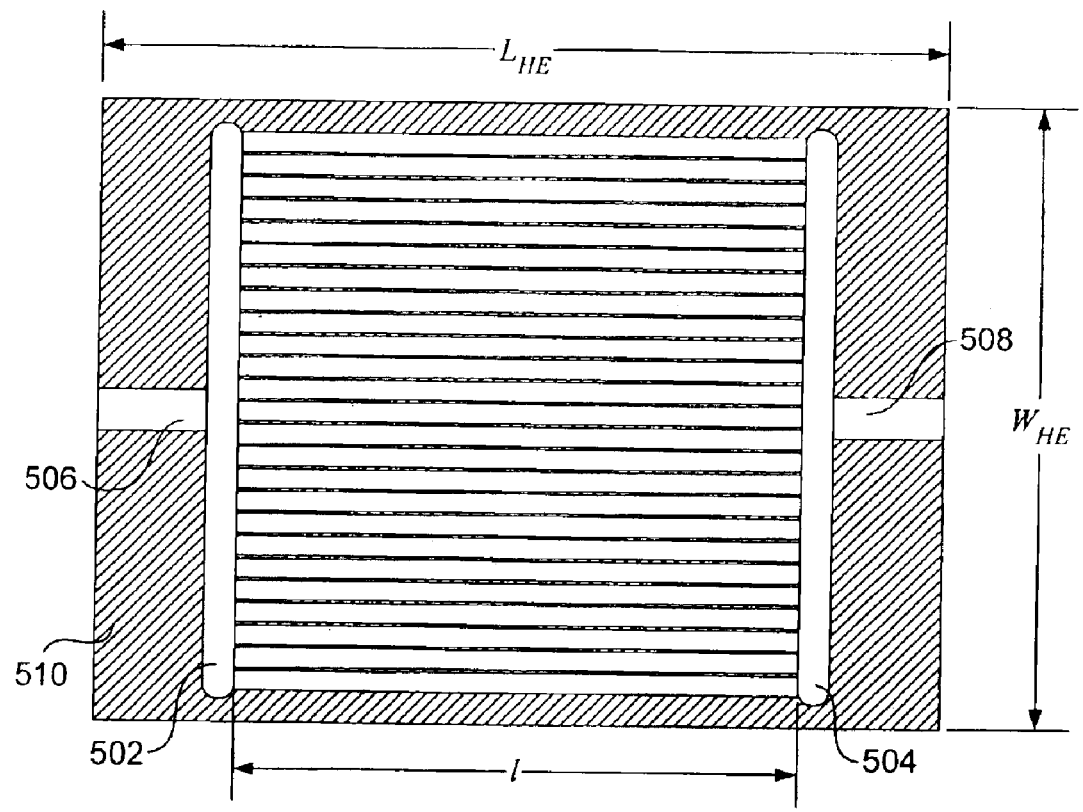
FIG. 5a is a plan view of a microchannel heat exchanger including parameters that define the configuration of the heat exchanger.
Figure 5B:
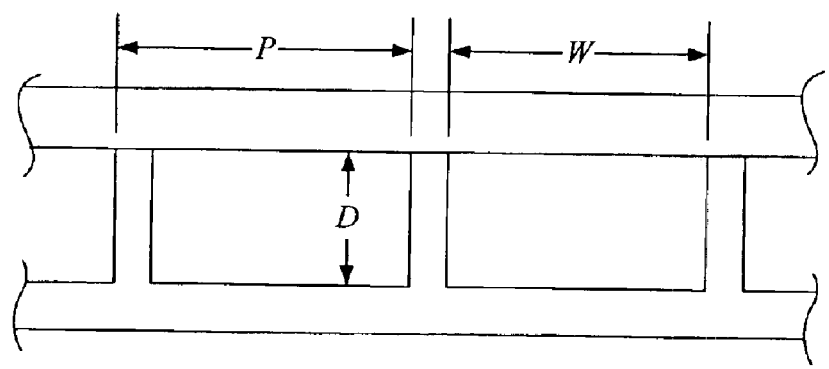

Plan and cross-section views illustrating typical channel configurations are shown in FIGS. 5A and 5B, respectively. In general, the channel configuration for a particular implementation will be a function of the heat transfer parameters (thermal coefficients, material thickness, heat dissipation requirements, thermal characteristics of working fluid), working fluid pumping characteristics (temperature, pressure, viscosity), and die and/or heat exchanger area. Although depicted as rectangular in configuration in the figures herein, the actual shape of the channels may include radiused profiles, or may even have substantially circular or oval profiles. The goal is to achieve a two-phase working condition in conjunction with a low and uniform junction temperature and a relatively low pressure drop across the heat exchanger.

Channel configuration parameters for rectangular channel shapes are shown in FIG. 5a and 5b. The parameters include a width W, a depth D, and a length l. In parallel channel configurations, such as shown in FIG. 5a, respective reservoirs 502 and 504 fluidly coupled to an inlet 506 and outlet 508. In essence, the reservoirs function as manifolds in coupling the microchannels to incoming and outgoing fluid lines. The plurality of microchannels will be formed in a thermal mass having a shape the generally corresponds to the die to which the heat exchanger is thermally coupled. For a rectangular configuration, which is likely to be most common but not limiting, the overall length of the heat exchanger is $L_{HE}$ and the overall width is $W_{HE}$.

Typically, the microchannels will have a hydraulic diameter (e.g., channel width W) in the hundreds of micrometers ($\mu$m), although sub-channels may be employed having hydraulic diameters of 100 $\mu$m or less. Similarly, the depth D of the channels will be of the same order of magnitude. It is believed that the pressure drop is key to achieving low and uniform junction temperature, which leads to increasing the channel widths. However, channels with high aspect rations (W/D) may induce flow instability due to the lateral variation of the flow velocity and the relatively low value of viscous forces per unit volume.

In one embodiment target for cooling a 20 mm×20 mm chip, 25 channels having a width w of 700 um, a depth d of 300 um and a pitch p of 800 um are formed in a thermal mass 510 having an overall length $L_{HE}$ of 30 mm and an overall width $W_{HE}$ of 22 mm, with a channel length of 20 mm. The working fluid is water, and the liquid water flow rate for the entire channel array is 20 ml/min.

Generally, the pumps used in the closed loop cooling system employing microchannel heat exchangers in accordance with the embodiments described herein may comprise electromechanical (e.g., MEMS-based) or electro-osmotic pumps (also referred to as "electric kinetic" or "E-K" pumps). In one respect, electro-osmotic pumps are advantageous over electromechanical pumps since they do not have any moving parts, which typically leads to improved reliability. Since both of these pump technologies are known in the microfluidic arts, further details are not provided herein.

Heat transfer rates have been simulated and/or calculated to verify the effectiveness of the various microchannel heat exchanger/spreader embodiments discussed above. Based on empirically measured heat transfer rates observed during two-phase water vapor convection heat transfer research studies, the simulations/calculations have indicated favorable cooling rates when compared with the prior art configurations discussed above. Furthermore, the simulations indicate that the microchannel heat exchangers are especially advantageous for cooling hot-spots in IC dies that do not produce an even heat distribution.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
an integrated circuit (IC) die; and
a thermal mass having a plurality of open microchannels formed therein, each microchannel defining a pair of walls having bases that are coupled to the IC die to form a hermetic seal between a surface of the IC die and the bases to form a plurality of closed microchannels.

2. The apparatus of claim 1, wherein the thermal mass is metallic and the IC die further includes a solderable layer formed thereon, and the hermetic seal is formed by soldering the bases of the open microchannel walls to the solderable layer.

3. The apparatus of claim 2, wherein the solderable layer is formed from at least one of the following metals: copper (Cu), gold (Au), nickel (Ni), aluminum (Al), titanium (Ti), tantalum (Ta), silver (Ag) and Platinum (Pt).

4. The apparatus of claim 2, wherein the solderable layer is substantially covered with a layer of solder such that base portions of the closed microchannels comprise solder.

5. The apparatus of claim 2, wherein solder only occupies areas proximate to the bases of the walls such that the solderable layer comprises base portions of the closed microchannels.

6. The apparatus of claim 2, wherein the solderable layer and the metallic thermal mass are made of substantially similar metals.

7. The apparatus of claim 1, wherein the hermetic seal is formed by a thermal adhesive disposed between the wall bases and the surface of the IC die.

8. The apparatus of claim 1, further comprising a substrate to which the IC die is flip-bonded.

9. The apparatus of claim 8, further comprising a chip carrier bonded to the substrate.

10. A closed loop cooling system, comprising:
a microchannel heat exchanger having an inlet and an outlet, comprising:
an integrated circuit (IC) die; and
a thermal mass having a plurality of open microchannels formed therein, each microchannel defining a pair of walls having bases that are coupled to the IC die to form a hermetic seal between a surface of the IC die and the bases to form a plurality of closed microchannels fluidly coupled at one end to the inlet and at the other end to the outlet;
a pump, having an inlet and an outlet fluidly coupled to the inlet of the microchannel heat exchanger, and
a heat rejecter, having an inlet fluidly coupled to the outlet of the microchannel heat exchanger and an outlet fluidly coupled to the inlet of the pump,
wherein the system employs a working fluid that transfers heat generated by the IC die to the heat rejecter using a two-phase heat exchange mechanism.

11. The cooling system of claim 10, wherein the working fluid is water.

12. The cooling system of claim 10, wherein the thermal mass is metallic and the IC die further includes a solderable layer formed thereon, and the hermetic seal is formed by soldering the bases of the open microchannel walls to the solderable layer.

13. The cooling system of claim 12, wherein solder only occupies areas proximate to the bases of the microchannel walls such that the solderable layer comprises base portions of the closed microchannels.

14. The cooling system of claim 12, wherein the solderable layer and the metallic thermal mass are made of substantially similar metals.

15. The cooling system of claim 10, wherein the pump comprises an electroosmotic pump.

16. An apparatus comprising:
 an integrated circuit (IC) die operatively coupled to a substrate; and
 a metallic microchannel heat exchanger having a plurality of microchannels passing therethrough, said microchannel heat exchanger operatively coupled to the substrate and thermally coupled to the IC die.

17. The apparatus of claim 16, wherein the microchannel heat exchanger comprises:
 a plate; and
 a metallic thermal mass having a plurality of open microchannels formed therein, each microchannel defining a pair of wails having top surface areas that are coupled to the plate to form a hermetic seal between the plate and the top surface areas to form a plurality of closed microchannels.

18. The apparatus of claim 16, wherein the microchannel heat exchanger comprises a single piece thermal mass having a plurality of microchannels passing therethrough.

19. The apparatus of claim 16, wherein the microchannel heat exchanger is thermally coupled to the IC die via a thermal interface material (TIM) layer.

20. The apparatus of claim 16, wherein the microchannel heat exchanger is operationally coupled to the substrate via a plurality of fasteners.

21. The apparatus of claim 20, further including a plurality of standoffs coupled to the substrate and to which said plurality of fasteners are coupled.

22. The apparatus of claim 16, wherein the IC die is flip-bonded to the substrate.

23. The apparatus of claim 16, further comprising a chip carrier bonded to the substrate.

24. A system, comprising:
 a microchannel heat exchanger having an inlet and an outlet, comprising:
  an integrated circuit (IC) die operatively coupled to a substrate, and
  a metallic microchannel heat exchanger having a plurality of microchannels passing therethrough, each fluidly coupled at one end to an inlet and at the other end to an outlet, said microchannel heat exchanger operatively coupled to the substrate and thermally coupled to the IC die;
 a pump, having an inlet and an outlet fluidly coupled to the inlet of the microchannel heat exchanger; and
 a heat rejecter, having an inlet fluidly coupled to the outlet of the microchannel heat exchanger and an outlet fluidly coupled to the inlet of the pump,
 wherein the system employs a working fluid that is transfers heat generated by the IC die to the heat rejecter using a two-phase heat exchange mechanism.

25. The system of claim 24, wherein the working fluid is water.

26. The system of claim 24, wherein the microchannel heat exchanger comprises:
 a plate; and
 a metallic thermal mass having a plurality of open microchannels formed therein, each microchannel defining a pair of walls having top surface areas that are coupled to the plate to form a hermetic seal between the plate and the top surface areas to form a plurality of closed microchannels.

27. The system of claim 24, wherein the microchannel heat exchanger comprises a single piece thermal mass having a plurality of microchannels passing therethrough.

28. The system of claim 24, wherein the pump comprises an electro osmotic pump.

29. The system of claim 24, wherein the microchannel heat exchanger is operationally coupled to the substrate via a plurality of fasteners.

30. The system of claim 24, wherein the IC die is flip-bonded to the substrate.

* * * * *

UNITED STATES PATENT AND TRADEMARK OFFICE
CERTIFICATE OF CORRECTION

PATENT NO. : 6,934,154 B2
DATED : August 23, 2005
INVENTOR(S) : Prasher et al.

It is certified that error appears in the above-identified patent and that said Letters Patent is hereby corrected as shown below:

<u>Column 9,</u>
Line 29, delete "wails" and insert -- walls --.

Signed and Sealed this

Fifteenth Day of November, 2005

JON W. DUDAS
*Director of the United States Patent and Trademark Office*